United States Patent
Jansen et al.

(10) Patent No.: US 7,880,860 B2
(45) Date of Patent: Feb. 1, 2011

(54) LITHOGRAPHIC APPARATUS AND DEVICE MANUFACTURING METHOD

(75) Inventors: Hans Jansen, Eindhoven (NL); Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Jeroen Johannes Sophia Maria Mertens, Duizel (NL); Johannes Catharinus Hubertus Mulkens, Waalre (NL); Marco Koert Stavenga, Eindhoven (NL); Bob Streefkerk, Tilburg (NL); Jan Cornelis Van Der Hoeven, Veldhoven (NL); Cedric Desire Grouwstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 15 days.

(21) Appl. No.: 11/015,767

(22) Filed: Dec. 20, 2004

(65) Prior Publication Data

US 2006/0132731 A1 Jun. 22, 2006

(51) Int. Cl.
G03B 27/52 (2006.01)
G03B 27/42 (2006.01)
(52) U.S. Cl. .......................... 355/30; 355/53
(58) Field of Classification Search ................ 355/30, 355/53, 67, 77; 356/239.2
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ........................ 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ............ 430/326 |
| 4,468,120 A | 8/1984 | Tanimoto et al. |
| 4,480,910 A | 11/1984 | Takanashi et al. ............. 355/30 |
| 4,509,852 A | 4/1985 | Tabarelli et al. ............... 355/30 |
| 5,040,020 A | 8/1991 | Rauschenbach et al. ....... 355/53 |
| 5,121,256 A | 6/1992 | Corle et al. .................. 359/664 |
| 5,257,128 A | 10/1993 | Diller et al. |
| 5,587,794 A | 12/1996 | Mizutani et al. |
| 5,610,683 A | 3/1997 | Takahashi ..................... 355/53 |
| 5,715,039 A | 2/1998 | Fukuda et al. ................. 355/53 |

(Continued)

FOREIGN PATENT DOCUMENTS

DE 206 607 2/1984

(Continued)

OTHER PUBLICATIONS

English translation of PCT/JP 2004/007417, dated Nov. 27, 2007.*

(Continued)

*Primary Examiner*—Hung Henry Nguyen
(74) *Attorney, Agent, or Firm*—Pillsbury Winthrop Shaw Pittman LLP

(57) ABSTRACT

A method and apparatus for cleaning the inside of an immersion lithographic apparatus is disclosed. In particular, a liquid supply system of the lithographic apparatus may be used to introduce a cleaning fluid into a space between the projection system and the substrate table of the lithographic apparatus. Additionally or alternatively, a cleaning device may be provided on the substrate table and an ultrasonic emitter may be provided to create an ultrasonic cleaning liquid.

29 Claims, 4 Drawing Sheets

U.S. PATENT DOCUMENTS

| | | | |
|---|---|---|---|
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,301,055 B1 | 10/2001 | Legrand et al. | |
| 6,459,472 B1 | 10/2002 | De Jager et al. | |
| 6,466,365 B1* | 10/2002 | Maier et al. | 359/355 |
| 6,496,257 B1* | 12/2002 | Taniguchi et al. | 356/239.2 |
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 6,781,670 B2 | 8/2004 | Krautschik | |
| 6,788,477 B2* | 9/2004 | Lin | 359/820 |
| 7,050,146 B2 | 5/2006 | Duineveld et al. | 355/30 |
| 7,061,578 B2 | 6/2006 | Levinson | |
| 7,091,502 B2 | 8/2006 | Gau et al. | 250/492.2 |
| 7,145,641 B2* | 12/2006 | Kroon et al. | 355/71 |
| 7,224,427 B2 | 5/2007 | Chang et al. | 355/30 |
| 7,224,434 B2 | 5/2007 | Tokita | 355/53 |
| 7,307,263 B2 | 12/2007 | Bakker et al. | 250/492.2 |
| 7,315,033 B1 | 1/2008 | Pawloski et al. | 250/492.2 |
| 7,362,412 B2 | 4/2008 | Holmes et al. | 355/30 |
| 7,385,670 B2 | 6/2008 | Compen et al. | 355/30 |
| 7,405,417 B2 | 7/2008 | Stevens et al. | 250/504 R |
| 7,460,207 B2 | 12/2008 | Mizutani et al. | 355/30 |
| 7,462,850 B2 | 12/2008 | Banine et al. | 250/504 R |
| 7,522,259 B2 | 4/2009 | Hazelton et al. | 355/30 |
| 7,522,263 B2 | 4/2009 | Van Mierlo et al. | 355/53 |
| 7,528,929 B2 | 5/2009 | Streefkerk et al. | 355/30 |
| 7,557,900 B2 | 7/2009 | Shiraishi | 355/53 |
| 2002/0020821 A1 | 2/2002 | Van Santen et al. | 250/492 |
| 2002/0163629 A1 | 11/2002 | Switkes et al. | 355/53 |
| 2003/0030916 A1 | 2/2003 | Suenaga | |
| 2003/0123040 A1 | 7/2003 | Almogy | 355/69 |
| 2003/0157538 A1 | 8/2003 | Krull et al. | |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | 355/30 |
| 2004/0125351 A1 | 7/2004 | Krautschik | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0239954 A1 | 12/2004 | Bischoff | 356/635 |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0042554 A1 | 2/2005 | Dierichs et al. | |
| 2005/0046813 A1 | 3/2005 | Streefkerk et al. | 355/30 |
| 2005/0046934 A1 | 3/2005 | Ho et al. | 359/380 |
| 2005/0048223 A1 | 3/2005 | Pawloski et al. | |
| 2005/0052632 A1 | 3/2005 | Miyajima | 355/53 |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0094125 A1 | 5/2005 | Arai | 355/72 |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0122505 A1 | 6/2005 | Miyajima | 355/72 |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | 355/53 |
| 2005/0140948 A1 | 6/2005 | Tokita | 355/30 |
| 2005/0141098 A1 | 6/2005 | Schuster | |
| 2005/0145803 A1 | 7/2005 | Hakey et al. | |
| 2005/0146693 A1 | 7/2005 | Ohsaki | 355/30 |
| 2005/0146694 A1 | 7/2005 | Tokita | 355/30 |
| 2005/0146695 A1 | 7/2005 | Kawakami | |
| 2005/0147920 A1 | 7/2005 | Lin et al. | |
| 2005/0151942 A1 | 7/2005 | Kawashima | 355/30 |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0200815 A1 | 9/2005 | Akamatsu | 353/53 |
| 2005/0205108 A1* | 9/2005 | Chang et al. | 134/1 |
| 2005/0213061 A1 | 9/2005 | Hakey et al. | |
| 2005/0213065 A1 | 9/2005 | Kitaoka | 355/53 |
| 2005/0213066 A1 | 9/2005 | Sumiyoshi | 355/53 |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219489 A1 | 10/2005 | Nei et al. | 355/53 |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0233081 A1 | 10/2005 | Tokita | 427/256 |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0264778 A1 | 12/2005 | Lof et al. | |
| 2005/0270505 A1 | 12/2005 | Smith | |
| 2005/0274898 A1 | 12/2005 | Watanabe et al. | 250/372 |
| 2006/0028628 A1 | 2/2006 | Lin et al. | |
| 2006/0050351 A1 | 3/2006 | Higashiki | 359/228 |
| 2006/0126043 A1 | 6/2006 | Mizutani et al. | |
| 2006/0209278 A1* | 9/2006 | Kiuchi et al. | 355/53 |
| 2006/0232757 A1 | 10/2006 | Tani et al. | 355/53 |
| 2006/0256316 A1 | 11/2006 | Tanno et al. | 355/72 |
| 2007/0064215 A1 | 3/2007 | Dirksen et al. | 355/77 |
| 2007/0127001 A1 | 6/2007 | Van Der Hoeven | 355/53 |
| 2007/0146658 A1 | 6/2007 | Van Mierlo et al. | 355/30 |

| | | | | | | |
|---|---|---|---|---|---|---|
| 2007/0171390 | A1 | 7/2007 | Hazelton et al. | JP | 2004-289126 | 10/2004 |
| 2007/0206279 | A1 | 9/2007 | Brueck et al. ............... 359/391 | JP | 2005-5713 | 1/2005 |
| 2007/0247600 | A1 | 10/2007 | Kobayashi et al. ............ 355/30 | JP | 2005-072404 | 3/2005 |
| 2007/0247601 | A1* | 10/2007 | Hazelton et al. ............. 355/30 | JP | 2005-079222 | 3/2005 |
| 2007/0258072 | A1 | 11/2007 | Nagasaka et al. ............ 355/53 | JP | 2006-134999 | 5/2006 |
| 2007/0285631 | A1 | 12/2007 | Stavenga et al. ............. 355/30 | JP | 2006-148093 | 6/2006 |
| 2008/0002162 | A1 | 1/2008 | Jansen et al. .................. 355/30 | JP | 2006-165502 | 6/2006 |
| 2008/0049201 | A1 | 2/2008 | Stavenga et al. ............. 355/30 | WO | WO99/49504 * | 9/1999 |
| 2008/0218712 | A1 | 9/2008 | Compen et al. ............. 355/30 | WO | WO 99/49504 | 9/1999 |
| 2008/0273181 | A1 | 11/2008 | De Jong et al. ............. 355/30 | WO | WO 02/091078 A1 | 11/2002 |
| 2008/0284990 | A1 | 11/2008 | De Jong et al. ............. 355/30 | WO | WO 03/077036 | 9/2003 |
| 2009/0025753 | A1 | 1/2009 | De Jong et al. .............. 134/10 | WO | WO 03/077037 | 9/2003 |
| 2009/0027635 | A1 | 1/2009 | De Jong et al. ............. 355/30 | WO | WO 2004/019128 | 3/2004 |
| 2009/0027636 | A1 | 1/2009 | Leenders et al. ............. 355/30 | WO | WO 2004/053596 A2 | 6/2004 |
| 2009/0086175 | A1 | 4/2009 | Streefkerk et al. ........... 355/30 | WO | WO 2004/053950 A1 | 6/2004 |
| 2009/0091716 | A1 | 4/2009 | Kadijk et al. ................. 355/30 | WO | WO 2004/053951 A1 | 6/2004 |
| 2009/0174870 | A1 | 7/2009 | De Jong et al. ............. 355/30 | WO | WO 2004/053952 A1 | 6/2004 |
| 2009/0174871 | A1 | 7/2009 | De Jong et al. ............. 355/30 | WO | WO 2004/053953 A1 | 6/2004 |
| 2009/0190105 | A1 | 7/2009 | De Jong ....................... 355/30 | WO | WO 2004/053954 A1 | 6/2004 |
| 2009/0195761 | A1 | 8/2009 | De Graaf et al. ............. 355/30 | WO | WO 2004/053955 A1 | 6/2004 |
| | | | | WO | WO 2004/053956 A1 | 6/2004 |
| | | FOREIGN PATENT DOCUMENTS | | WO | WO 2004/053957 A1 | 6/2004 |
| | | | | WO | WO 2004/053958 A1 | 6/2004 |
| DE | | 221 563 | 4/1985 | WO | WO 2004/053959 A1 | 6/2004 |
| DE | | 224448 | 7/1985 | WO | WO 2004/055803 A1 | 7/2004 |
| DE | | 242880 | 2/1987 | WO | WO 2004/057589 A1 | 7/2004 |
| EP | | 0023231 | 2/1981 | WO | WO 2004/057590 A1 | 7/2004 |
| EP | | 0418427 | 3/1991 | WO | WO 2004/077154 A1 | 9/2004 |
| EP | | 0 834 773 A2 | 4/1998 | WO | WO 2004/081666 A1 | 9/2004 |
| EP | | 1039511 | 9/2000 | WO | WO 2004/090577 | 10/2004 |
| EP | | 1 486 827 | 12/2004 | WO | WO 2004/090633 | 10/2004 |
| FR | | 2474708 | 7/1981 | WO | WO 2004/090634 | 10/2004 |
| JP | | A 57-153433 | 9/1982 | WO | WO 2004/092830 | 10/2004 |
| JP | | 58-202448 | 11/1983 | WO | WO 2004/092833 | 10/2004 |
| JP | | A-59-19912 | 2/1984 | WO | WO 2004/093130 | 10/2004 |
| JP | | 62-065326 | 3/1987 | WO | WO 2004/093130 A2 * | 10/2004 |
| JP | | 62-121417 | 6/1987 | WO | WO 2004/093159 | 10/2004 |
| JP | | 63-157419 | 6/1988 | WO | WO 2004/093160 | 10/2004 |
| JP | | 04-190873 | 7/1992 | WO | WO 2004/095135 | 11/2004 |
| JP | | 04-305915 | 10/1992 | WO | PCT/JP2004/007417 * | 12/2004 |
| JP | | 04-305917 | 10/1992 | WO | WO 2004/105107 | 12/2004 |
| JP | | A-5-62877 | 3/1993 | WO | WO 2005/001432 A2 | 1/2005 |
| JP | | A 05-304072 | 11/1993 | WO | WO 2005/003864 A2 | 1/2005 |
| JP | | 4-6104167 A * | 4/1994 | WO | WO 2005/006026 A1 | 1/2005 |
| JP | | 06-124873 | 5/1994 | WO | WO 2005/008339 A2 | 1/2005 |
| JP | | A 06-168866 | 6/1994 | WO | WO 2005/010611 | 2/2005 |
| JP | | 06-254304 | 9/1994 | WO | WO 2005/013008 A2 | 2/2005 |
| JP | | 06-262005 | 9/1994 | WO | WO 2005/015283 A1 | 2/2005 |
| JP | | 07-132262 | 5/1995 | WO | WO 2005/017625 A2 | 2/2005 |
| JP | | 07-220990 | 8/1995 | WO | WO 2005/019935 A2 | 3/2005 |
| JP | | A 07-220990 | 8/1995 | WO | WO 2005/022266 A2 | 3/2005 |
| JP | | A-8-316125 | 11/1996 | WO | WO 2005/024325 A2 | 3/2005 |
| JP | | A 10-154659 | 6/1998 | WO | WO 2005/024517 | 3/2005 |
| JP | | 10-228661 | 8/1998 | WO | WO 2005/034174 A2 | 4/2005 |
| JP | | 10-255319 | 9/1998 | WO | WO 2005/050324 A2 | 6/2005 |
| JP | | A 10-255319 | 9/1998 | WO | WO 2005/054953 A2 | 6/2005 |
| JP | | 10-303114 | 11/1998 | WO | WO 2005/054955 A2 | 6/2005 |
| JP | | 10-340846 | 12/1998 | WO | WO 2005/059617 A2 | 6/2005 |
| JP | | 11-162831 | 6/1999 | WO | WO 2005/059618 A2 | 6/2005 |
| JP | | 11-176727 | 7/1999 | WO | WO 2005/059645 A2 | 6/2005 |
| JP | | 11-283903 | 10/1999 | WO | WO 2005/059654 A1 | 6/2005 |
| JP | | 11-290752 | 10/1999 | WO | WO 2005/062128 A2 | 7/2005 |
| JP | | 2000-058436 | 2/2000 | WO | WO 2005/064400 A2 | 7/2005 |
| JP | | 2000-147204 | 5/2000 | WO | WO 2005/064405 A2 | 7/2005 |
| JP | | 2000-319038 | 11/2000 | WO | WO 2005/069055 A2 | 7/2005 |
| JP | | 2000-323396 | 11/2000 | WO | WO 2005/069078 A1 | 7/2005 |
| JP | | 2001-091849 | 4/2001 | WO | WO 2005/069081 A2 | 7/2005 |
| JP | | 2001-121063 | 5/2001 | WO | WO 2005/071491 A2 | 8/2005 |
| JP | | 2001-175005 | 6/2001 | WO | WO 2005/074606 A2 | 8/2005 |
| JP | | 2002-236111 | 8/2002 | WO | WO 2005/076084 A1 | 8/2005 |
| JP | | 2004-40107 | 2/2004 | WO | WO 2005/081030 A1 | 9/2005 |
| JP | | 2004-193252 | 7/2004 | WO | WO 2005/081067 A1 | 9/2005 |
| JP | | 2004-207696 | 7/2004 | WO | WO 2005/122218 | 12/2005 |

| | | |
|---|---|---|
| WO | WO 2006/041086 | 4/2006 |
| WO | WO 2006/062065 | 6/2006 |
| WO | 2007/136089 A1 | 11/2007 |

OTHER PUBLICATIONS

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-2669.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, *J. Microlith., Microfab., Microsyst.* 1(1):7-12 (2002).

Information Disclosure Statement filed Feb. 8, 2007 for U.S. Appl. No. 11/703,802.

Office Action dated Jun. 29, 2007 issued for U.S. Appl. No. 11/703,802.

Emerging Lithographic Technologies VI, Proceedings of SPIE, vol. 4688 (2002), "Semiconductor Foundry, Lithography, and Partners", B.J. Lin, pp. 11-24.

Optical Microlithography XV, Proceedings of SPIE, vol. 4691 (2002), "Resolution Enhancement of 157 nm Lithography by Liquid Immersion", M. Switkes et al., pp. 459-465.

J. Microlith., Microfab., Microsys., vol. 1 No. 3, Oct. 2002, Society of Photo-Optical Instrumentation Engineers, "Resolution enhancement of 157 nm lithography by liquid immersion", M. Switkes et al., pp. 1-4.

Optical Microlithography XVI, Proceedings of SPIE vol. 5040 (2003), "Immersion lithography; its potential performance and issues", Soichi Owa et al., pp. 724-733.

English translation of Notice of Reasons for Rejection issued for Japanese Patent Application No. 2005-364310, dated Dec. 2, 2008.

English Translation of the Decision of Rejection as issued for Japanese Patent Application No. 2005-364310, dated Mar. 24, 2009.

Non-final Office Action as issued for U.S. Appl. No. 11/767,425, dated Jan. 30, 2008.

Final Office Action as Issued for U.S. Appl. No. 11/767,425, dated Oct. 31, 2008.

Non-final Office Action as issued for U.S. Appl. No. 11/767,425, dated Jul. 15, 2009.

* cited by examiner

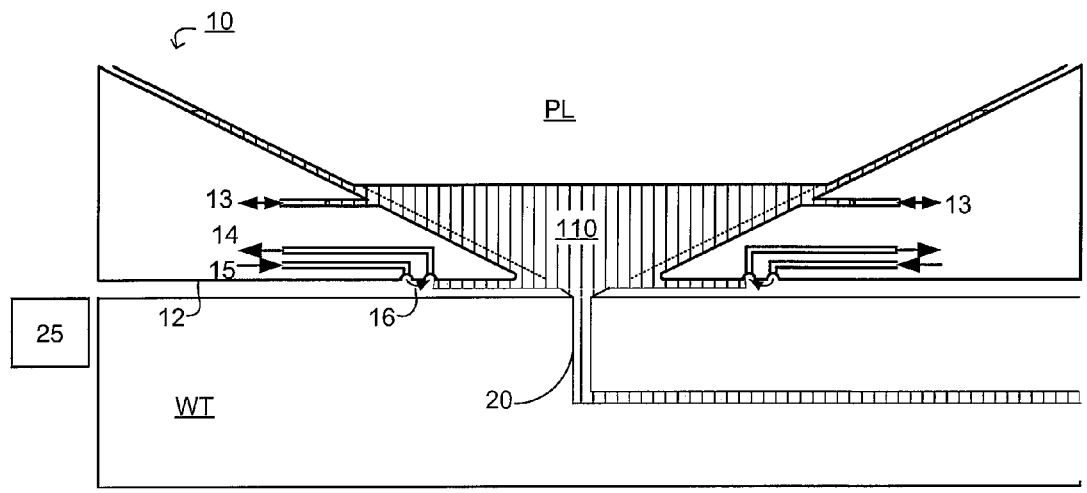
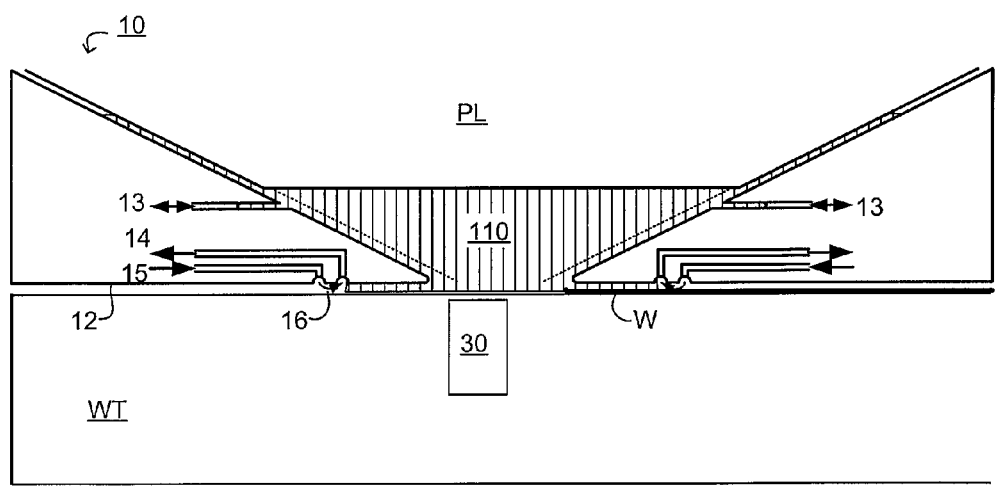

LITHOGRAPHIC APPARATUS AND DEVICE MANUFACTURING METHOD

FIELD

The present invention relates to a lithographic apparatus and a device manufacturing method. In particular, the present invention relates to a cleaning device for an immersion lithographic apparatus and a method of cleaning the projection system and/or the substrate table of an immersion lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Ideally, the projection system of a lithographic apparatus would never need to be cleaned, since this is a complicated and delicate task that may require lithographic apparatus downtime and dismantling of the lithographic apparatus. However, due to, for example, a liquid provided to a space between a final element of the projection system and a substrate in an immersion lithographic apparatus, the final element may become contaminated as a result of chemical reactions or drying stains. Additionally or alternatively, a substrate table of the lithographic apparatus may become contaminated, particularly the area outside where the substrate is held on the substrate table.

Cleaning the projection system and/or the substrate table may be done manually by a person wiping the projection system and/or substrate table with a soft tissue and using a mild solvent. As well as the downtime problem, this method may run the risk of scratching parts of the lithographic apparatus, such as the final element of the projection, and uneven cleaning that can create, for example, undesirable illumination dose variations over the projection field when the final element is cleaned.

SUMMARY

Accordingly, it would be advantageous, for example, to provide a method for cleaning a final element of the projection system and/or a substrate table without having to dismantle the liquid supply system and/or which does not run the risk of scratching.

According to an aspect of the present invention, there is provided a lithographic apparatus, comprising:

a substrate table configured to hold a substrate;

a projection system configured to project a patterned beam of radiation onto the substrate, the projection system comprising a final optical element adjacent the substrate;

a liquid supply system configured to provide a liquid to a space between the projection system and the substrate table; and a cleaning device configured to clean the final optical element, the substrate table, or both.

According to another aspect of the invention, there is provided a lithographic apparatus, comprising:

a substrate table configured to hold a substrate;

a projection system configured to project a patterned beam of radiation onto the substrate, the projection system comprising a final optical element adjacent the substrate;

a liquid supply system configured to provide a liquid to a space between the projection system and the substrate table; and a coater configured to coat the final optical element, the substrate table, or both.

According to another aspect of the invention, there is provided the use of a fluid supply system in a lithographic apparatus for the in-line application of (i) a cleaning fluid, (ii) a coating fluid, (iii) a coating remover, or (iv) any combination of (i)-(iii), to a space between a projection system and a substrate table of the lithographic apparatus.

According to another aspect of the invention, there is provided a spray unit configured to spray a cleaning fluid onto a final optical element of a lithographic apparatus projection system.

According to another aspect of the invention, there is provided an ultrasonic emitter configured to turn a liquid confined in a space between a projection system and a substrate table of lithographic apparatus into an ultrasonic cleaning liquid.

According to another aspect of the invention, there is provided a method of cleaning a projection system optical element, a substrate table, or both, in a lithographic apparatus configured to have a liquid in a space between the optical element and the substrate table, the method comprising circulating a cleaning fluid through the space.

According to another aspect of the invention, there is provided a method of coating a projection system optical element, a substrate table, or both, in a lithographic apparatus configured to have a liquid in a space between the optical element and the substrate table, the method comprising circulating a coating fluid through the space.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts a wash station in the substrate table according to an embodiment of the invention; and FIG. 8 depicts an ultrasonic cleaning bath according to an embodiment of the invention.

DETAILED DESCRIPTION

Figure 1:
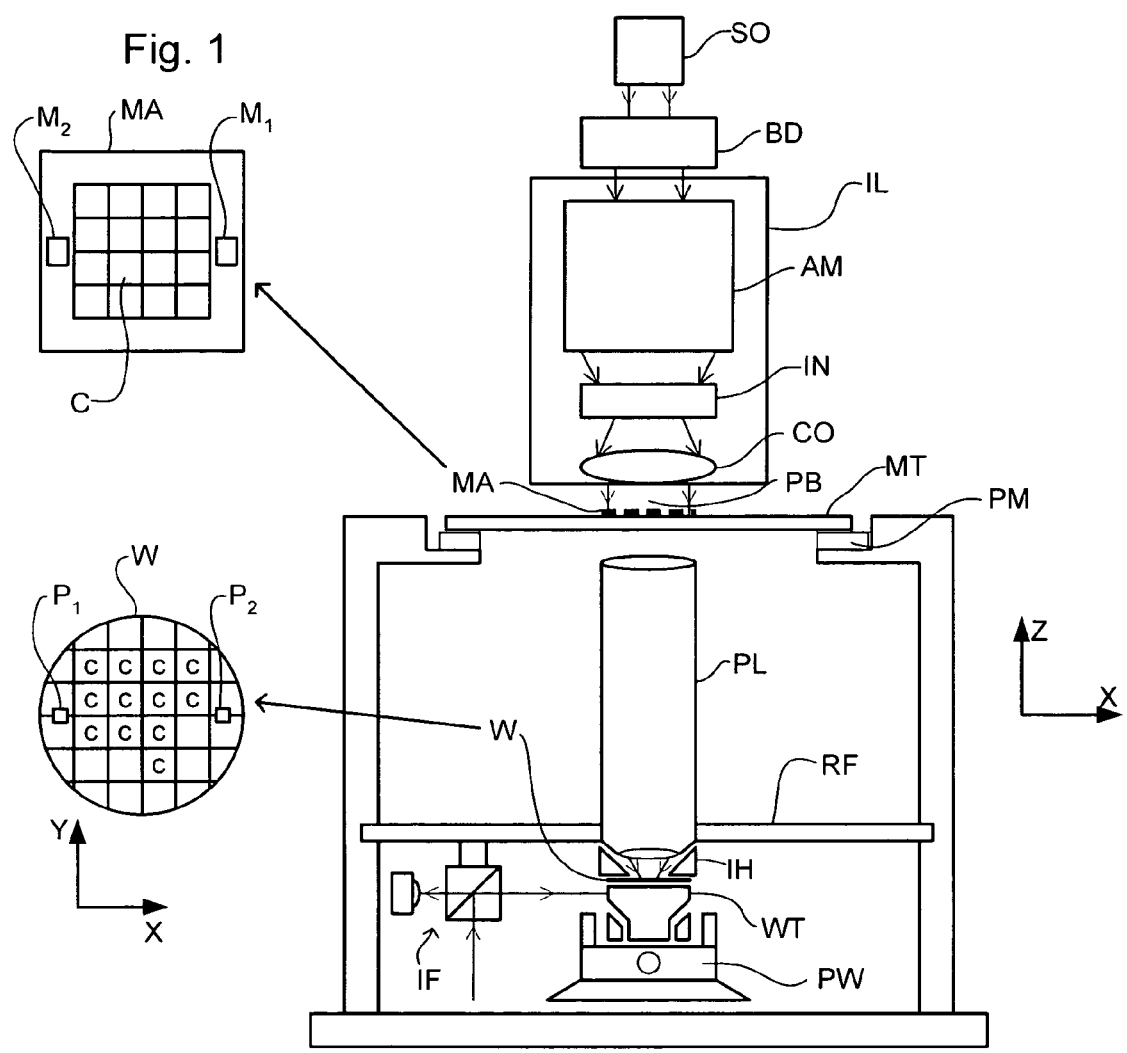
FIG. 1 depicts a lithographic apparatus according to an embodiment of the invention.
Figure 2:
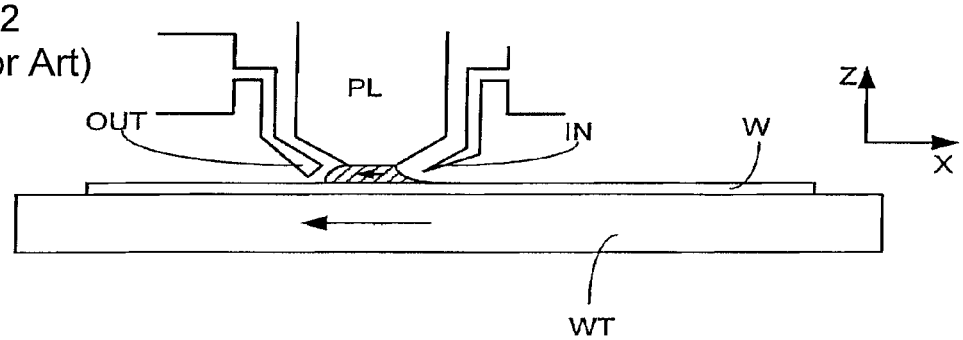
FIGS. 2 and 3 depict a liquid supply system for use in a lithographic projection apparatus.
Figure 3:
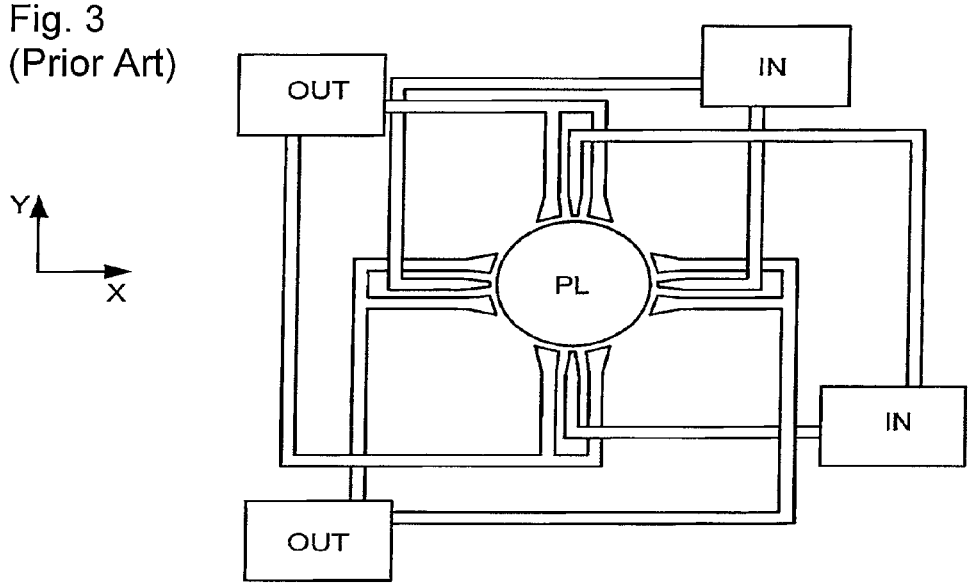

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure MT (e.g., mask table), and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
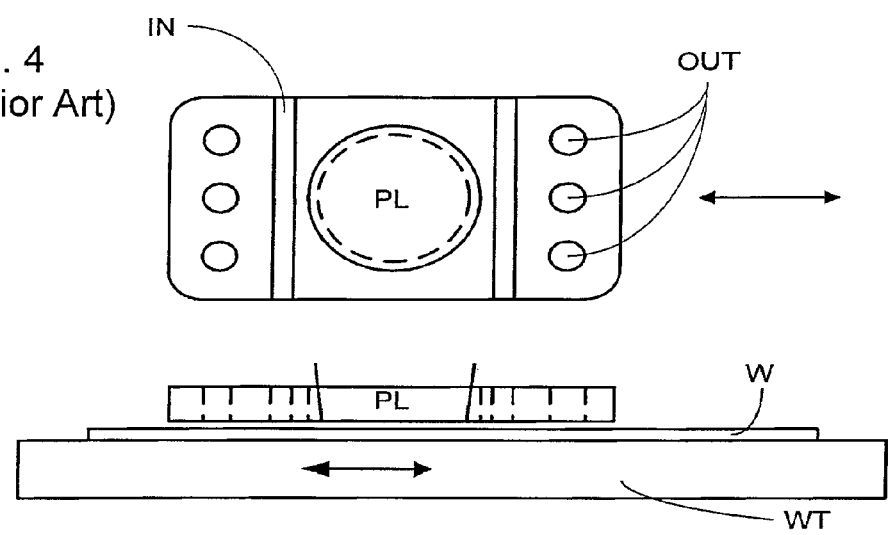
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another immersion lithography solution with a localized liquid supply system solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 5:
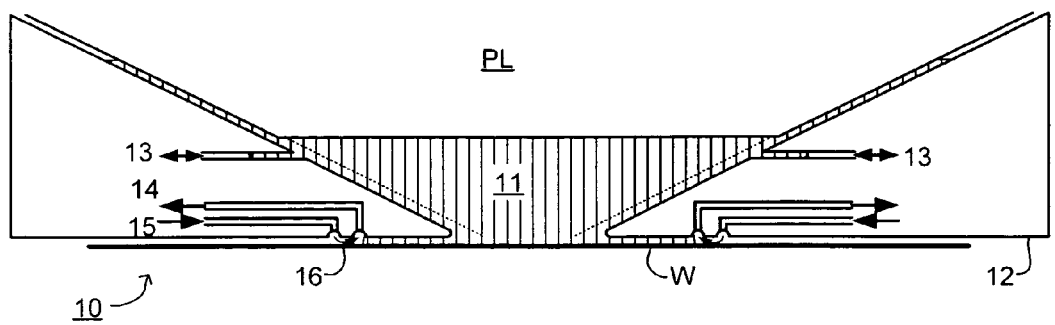
FIG. 5 depicts a liquid supply system according to an embodiment of the present invention.

FIG. 5 shows a liquid supply system comprising a liquid confinement structure (sometimes referred to as an immersion hood or showerhead) according to an embodiment of the invention. In particular, FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. It will be understood by the person skilled in the art that other types of seal could be used to contain the liquid such as simply an outlet to remove liquid and/or gas.

Referring to FIG. 5, the liquid confinement structure 12 and the projection system PL are positioned in such a way over the substrate W that the substrate may be exposed, the patterned beam of radiation passing through the liquid 11 from the projection system PL to the substrate W.

Figure 6:
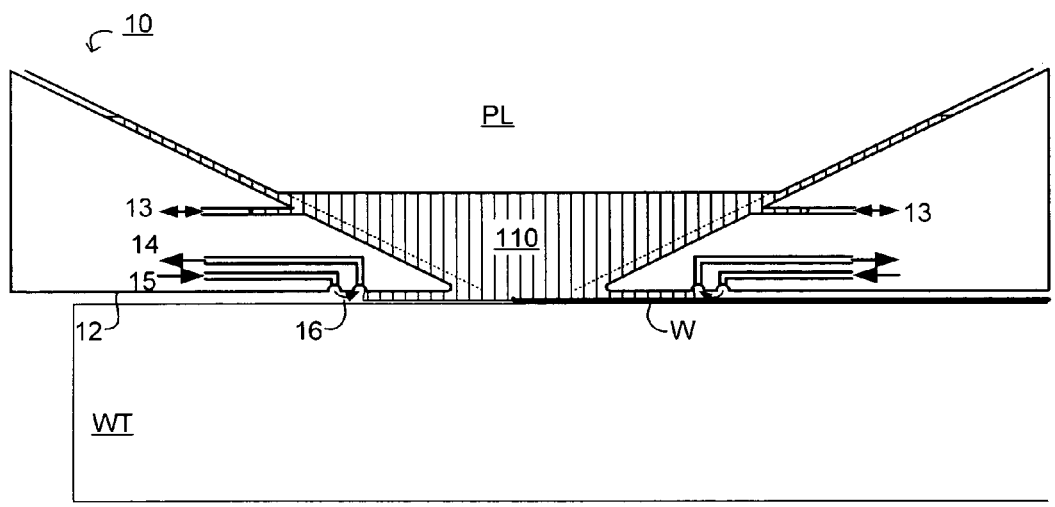
FIG. 6 depicts the liquid confinement structure of FIG. 5 positioned over the substrate table.

In FIG. 6, the liquid confinement structure 12 and the substrate table WT have moved relative to each other so that the aperture holding liquid of the liquid confinement structure 12 is no longer completely over the substrate W. While the liquid confinement structure aperture extends beyond the surface of the substrate W, for example, the immersion liquid 11 can be replaced with a cleaning fluid 110 which may be supplied to the liquid confinement structure via the same outlet 13 as the immersion liquid 11. In this case, the cleaning device is the liquid confinement structure.

The cleaning fluid 110 may be used to remove contaminants from both the final element of the projection system PL and/or the substrate table WT. Furthermore, the pressurized gas flow via outlet 14 and inlet 15 may also be used to clean the substrate table. Contaminants are washed away or broken down and removed when the cleaning fluid 110 is removed and replaced by immersion liquid 11, ready to expose the next substrate. The cleaning fluid 110, which may be supplied by the liquid confinement structure, itself may be a solvent, a detergent, a liquefied gas such as carbon dioxide, or a dissolved gas such as oxygen, ozone or nitrogen.

The liquid confinement structure may be used to contain cleaning gases as well as liquids. The gap between the projection system PL and the liquid confinement structure 12 may be temporarily closed during the cleaning action and even gases that are potentially harmful to humans or to other parts of the lithographic apparatus may be used.

This reduction in particle contamination by a different use of the liquid confinement structure may be beneficial for the processing quality of the lithographic apparatus. The cleaning action using the liquid confinement structure may be part of an exposure, or it may be part of a maintenance action when, for example, contamination levels require it. An advantage of this approach is that there is no need to dismantle the lithographic apparatus to clean.

Software may be used to guide movement of the substrate table further in every direction or desired direction than is required for mere exposure of the substrate. In this way, the entirety or a desired part of the substrate table WT may be cleaned because the entire or desired surface may, at some point, be beneath the liquid confinement structure.

Another cleaning device configured to supply cleaning fluid to the liquid confinement structure is, referring to FIG. 7, a cleaning station 20 provided in the substrate table WT. When cleaning of the final element of the projection system PL and/or of the substrate table WT is required, the cleaning station 20 is moved relative to the liquid confinement structure so that the cleaning station is below the final element. In this way, cleaning liquid 110 is provided from the cleaning station 20 by a sprayer configured to sprayed the cleaning liquid 110 into the reservoir of the liquid confinement structure 12 and onto the final element of the projection system PL. The cleaning liquid 110 can thereby clean the final element. Additionally or alternatively, the cleaning liquid 110 may fill up the reservoir so that the substrate table WT may be cleaned. Once cleaning is finished, the liquid confinement structure 12 may then be activated so that ultra pure water or any other appropriate liquid rinses away any remaining cleaning liquid. Instead of a cleaning liquid, the cleaning station may provide a cleaning gas such as ozone or a plasma. In an embodiment, the cleaning liquid may be liquid $CO_2$ (this cleaning may be known as "snow cleaning").

The cleaning fluid used will depend on the contaminant to be removed. Drying stains are usually salt deposits and depending on the exact salt, high or low pH solutions may be used. Other detergents may be used to remove metal deposits. For organic contaminants, organic solvents such as heptane, hexane (which are non polar), alcohol, e.g. ethanol, or acetone (which are polar) may be used.

Further, a projection beam may be projected through the final element PL during cleaning to break down certain organic contaminants.

In an embodiment, it is desired to avoid any mechanical contact with the final element to reduce the risk of scratching the final element. However, if it is needed, the liquid confinement structure 12 and/or the substrate table WT may contain a brush on a motor.

The cleaning station 20 may be positioned anywhere in or on the substrate table WT or in or on the liquid confinement structure 12 so that the liquid confinement structure itself, a closing plate 25 and so on may also be cleaned. Many surfaces in an immersion lithographic apparatus are at risk of contamination because of drying stains, organics contaminants from the resist evaporating off the substrate, contaminations from the immersion liquid itself, and so on. Accordingly, the cleaning fluid 110, whether provided by the liquid confinement structure 12 or by the cleaning station 20, may be provided to all the same surfaces that may be exposed to immersion liquid.

FIG. 8 shows another embodiment in which the immersion system, and in particular the final element of the projection system PL, may be cleaned. In this case, rather than or as well as introducing a cleaning fluid 110, the liquid in the liquid confinement structure 12 may be transformed into an ultrasonic cleaning bath by the incorporation of an ultrasonic emitter 30 in the substrate table WT and/or in the liquid confinement structure 12 as a cleaning device.

Ultrasonic cleaning is particularly good for removing contaminants that have dried and hardened, for example, salts on the final element of the projection system PL. Ultrasonic cleaning is also useful for cleaning in areas that brushes or tissues cannot reach, such as the pimples in a pimple or burl-plate of the substrate table WT.

As well as or instead of a cleaning fluid 110, a coating may be introduced into the reservoir of the liquid confinement structure 12 via the liquid confinement structure 12 and/or via the cleaning station 20. In this case, the liquid confinement structure and/or the cleaning station may be referred to as a coater. The coating may be used to protect the liquid confinement structure, the final element, or other surfaces, or may be for other uses which would be clear to the person skilled in the art. A coating removal agent may be introduced into the liquid confinement structure in the same way.

Another cleaning device that may be used for cleaning microbiological contamination (i.e., bacterial cultures) is UV radiation. The radiation source of the lithographic apparatus may be used to supply this UV radiation, although another source could be used. For example, the radiation source of a lithographic apparatus may emit 193 nm radiation, a type of radiation which kills bacteria that may be present in the liquid confinement structure, on the substrate table, and/or on the final element.

There are at least two ways in which the UV radiation from the projection system PL itself may be used to kill bacteria on the substrate table. A first way is with a closing plate that is transparent to the UV radiation so that the closing plate holds the liquid within the liquid confinement structure 12 but the UV radiation may nonetheless reach the substrate table WT and kill the bacteria on it. A second way is not to use a closing disc, but to irradiate bacteria and simultaneously to wash the dead bacteria away with the flow of the liquid in the liquid confinement structure 12.

In the case where bacteria is to be removed from the final element of the projection system PL or a surface of the liquid confinement structure 12, the UV radiation may be provided by the projection system PL itself as described above, or it may be provided by a separate optical element. For example, an optical element positioned in the same place as the ultrasound emitter 30 in FIG. 8 may be used to supply the UV radiation to the final element of the projection system PL and/or a surface of the liquid confinement structure 12. The UV radiation may in that case, for example, enter the liquid confinement structure 12 via a closing plate that is transparent to the UV radiation.

Using UV radiation has an advantage of keeping microbiological contamination low while preventing prolonged downtime, which can be caused by having to perform wet chemical sanitizing using hydrogen peroxide or ozonated water, for instance. This treatment can be carried out as a preventative or curative measure.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, such as those types mentioned above, and whether the immersion liquid is provided in the form of a bath or only on a localized surface area of the substrate. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
 a substrate table configured to hold a substrate;
 a projection system configured to project a patterned beam of radiation onto the substrate, the projection system comprising a final optical element adjacent the substrate;
 a liquid supply system having an immersion liquid outlet configured to provide an immersion liquid to a space between the projection system and the substrate table for projection of the patterned beam; and
 a cleaning device configured to clean the final optical element, the substrate table, or both, the cleaning device comprising:
  a liquid confinement structure of the liquid supply system, the liquid confinement structure configured to partially confine immersion liquid in the space during a projection of the patterned beam onto the substrate and to partially confine a cleaning fluid in the space during a cleaning using the cleaning device; and
  a cleaning fluid outlet, different from the immersion liquid outlet, to supply cleaning fluid to the space for cleaning,
  wherein the immersion liquid flow through the immersion liquid outlet does not share a flow path with cleaning fluid flow through the cleaning fluid outlet immediately before supply of immersion liquid or cleaning fluid to the space.

2. The apparatus according to claim 1, wherein the cleaning device is configured to clean the final optical element in-line in the lithographic apparatus.

3. The apparatus according to claim 1, wherein the cleaning device comprises an ultrasonic transmitter configured to turn cleaning fluid in the space into an ultrasonic cleaning fluid.

4. The apparatus according to claim 1, wherein the cleaning device comprises an optical element configured to supply low wavelength ultraviolet radiation.

5. The apparatus according to claim 4, wherein the liquid supply system comprises a surface that is transparent to the low wavelength ultraviolet radiation.

6. The apparatus according to claim 4, wherein the low wavelength ultraviolet radiation has a wavelength of about 193 nm.

7. The apparatus according to claim 1, wherein the cleaning device is configured to supply cleaning fluid to the space.

8. The apparatus according to claim 7, wherein the cleaning fluid comprises a solvent.

9. The apparatus according to claim 7, wherein the cleaning fluid comprise a detergent.

10. The apparatus according to claim 7, wherein the cleaning fluid comprises a dissolved gas.

11. The apparatus according to claim 10, wherein the gas is selected from oxygen, ozone or nitrogen.

12. The apparatus according to claim 1, wherein a part of the cleaning device is in the substrate table.

13. The apparatus according to claim 12, wherein the cleaning device comprises a spray unit.

14. The apparatus according to claim 13, wherein the spray unit comprises the cleaning fluid outlet and is configured to spray cleaning fluid onto the optical element, the substrate table, or both.

15. The apparatus according to claim 14, wherein the cleaning fluid comprises ozone.

16. The apparatus according to claim 14, wherein the cleaning fluid comprises plasma.

17. The apparatus according to claim 14, wherein the cleaning fluid comprises liquid carbon dioxide.

18. The apparatus according to claim 14, wherein the cleaning fluid comprises a non-polar organic solvent.

19. The apparatus according to claim 14, wherein the cleaning fluid comprises a polar organic solvent.

20. The apparatus according to claim 14, wherein the cleaning device is configured to clean only the final optical element or to clean only the substrate table.

21. A lithographic apparatus, comprising:
a substrate table configured to hold a substrate;
a projection system configured to project a patterned beam of radiation onto the substrate, the projection system comprising a final optical element adjacent the substrate; and
a liquid supply system having an immersion liquid outlet configured to provide an immersion liquid to a space between the projection system and the substrate table for projection of the patterned beam onto the substrate and having a different cleaning fluid outlet configured to provide cleaning fluid to clean the final optical element, the substrate table, or both,
wherein the immersion liquid flow through the immersion liquid outlet does not share a flow path with cleaning fluid flow through the cleaning fluid outlet immediately before supply of immersion liquid or cleaning fluid to the space.

22. The apparatus according to claim 21, wherein the liquid supply system comprises a liquid confinement structure configured to at least partially confine liquid in the space and to clean the final optical element in-line in the lithographic apparatus.

23. The apparatus according to claim 21, wherein the liquid supply system is configured to supply cleaning fluid to the space.

24. A lithographic apparatus, comprising:
a substrate table configured to hold a substrate;
a projection system configured to project a patterned beam of radiation onto the substrate, the projection system comprising a final optical element adjacent the substrate;
a liquid supply system configured to provide a liquid to a space between the projection system and the substrate table;
a cleaning device configured to clean the final optical element, the substrate table, or both; and
a coater configured to coat the final optical element, the substrate table, or both with a coating fluid.

25. The apparatus according to claim 24, wherein the coater comprises a spray unit in the substrate table.

26. The apparatus according to claim 24, wherein the coater comprises a liquid confinement structure of the liquid supply system, the coater configured to coat the final optical element in-line in the lithographic apparatus.

27. The apparatus according to claim 24, wherein the cleaning device and coater comprise the same apparatus.

28. The apparatus according to claim 1, wherein the cleaning is separate from the projection of the patterned beam onto the substrate.

29. The apparatus according to claim 21, configured to clean at a time when the patterned beam is not being projected onto the substrate.

* * * * *